(12) United States Patent
Ye et al.

(10) Patent No.: US 8,975,625 B2
(45) Date of Patent: Mar. 10, 2015

(54) TFT WITH INSERT IN PASSIVATION LAYER OR ETCH STOP LAYER

(71) Applicant: Applied Materials, Inc., Santa Clara, CA (US)

(72) Inventors: Yan Ye, Saratoga, CA (US); Harvey You, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/932,340

(22) Filed: Jul. 1, 2013

(65) Prior Publication Data

US 2014/0339536 A1 Nov. 20, 2014

Related U.S. Application Data

(60) Provisional application No. 61/823,336, filed on May 14, 2013.

(51) Int. Cl.
| | |
|---|---|
| *H01L 29/10* | (2006.01) |
| *H01L 29/786* | (2006.01) |
| *H01L 21/283* | (2006.01) |
| *H01L 29/24* | (2006.01) |

(52) U.S. Cl.
CPC .......... *H01L 29/7869* (2013.01); *H01L 21/283* (2013.01); *H01L 29/24* (2013.01)
USPC .............................. 257/43; 257/327

(58) Field of Classification Search
CPC ............ H01L 29/7869; H01L 27/1225; H01L 29/66742; H01L 29/78669
See application file for complete search history.

(56) References Cited

U.S. PATENT DOCUMENTS

| | | | | |
|---|---|---|---|---|
| 5,317,432 | A  * | 5/1994 | Ino ................................... | 349/39 |
| 6,362,097 | B1 * | 3/2002 | Demaray et al. .............. | 438/674 |
| 2004/0113227 | A1 * | 6/2004 | Goto et al. ..................... | 257/506 |
| 2004/0123804 | A1 * | 7/2004 | Yamazaki et al. ...... | 118/723 VE |
| 2008/0023703 | A1 * | 1/2008 | Hoffman et al. ................ | 257/59 |
| 2009/0087954 | A1 * | 4/2009 | Lin et al. ....................... | 438/151 |

* cited by examiner

*Primary Examiner* — Tucker Wright
(74) *Attorney, Agent, or Firm* — Patterson & Sheridan, LLP

(57) ABSTRACT

Embodiments disclosed herein generally relate to thin film transistors with one or more trenches to control the threshold voltage and off-current and methods of making the same. In one embodiment, a semiconductor device can include a substrate comprising a surface with a thin film transistor formed thereon, a first passivation layer formed over the thin film transistor, a trench formed within the first passivation layer and a second passivation layer formed over the first passivation layer and within the trench.

9 Claims, 3 Drawing Sheets

TFT WITH INSERT IN PASSIVATION LAYER OR ETCH STOP LAYER

CROSS-REFERENCE TO RELATED APPLICATIONS

This application claims benefit of U.S. Provisional Patent Application Ser. No. 61/823,336, filed May 14, 2013 (APPM/17011USL), which is incorporated herein by reference.

BACKGROUND OF THE INVENTION

1. Field of the Invention

Embodiments of the present invention generally relate to improving the threshold voltage in a thin film transistor (TFT).

2. Description of the Related Art

Current interest in TFT arrays is particularly high because these devices may be used in liquid crystal active matrix displays (LCDs) of the kind often employed for computer and television flat panels. The LCDs may also contain light emitting diodes (LEDs), such as organic light emitting diodes (OLEDs) for back lighting. The LEDs and OLEDs require TFTs for addressing the activity of the displays.

The current driven through the TFTs (i.e., the on-current) is limited by the channel material (often referred to as the active material, semiconductor material or semiconductor active material) as well as the channel width and length. Additionally, the turn-on voltage is determined by the accumulation of the carrier in the channel area of the semiconductor layer which could change as the shift of the fixed charge in the semiconductor material or the charge trapping in interfaces and the threshold voltage shifts after bias temperature stress or current temperature stress. Current MO-TFTs, such as indium gallium zinc oxide (IGZO), zinc oxide (ZnO) and zinc oxynitride (ZnON) TFT devices, have interface problems which can include mobility problems and offset turn on voltages.

Therefore, there is a need in the art for better control of the threshold voltage of TFTs.

SUMMARY OF THE INVENTION

The present invention generally relates to controlling the threshold voltage and off-current of a TFT. In one embodiment, a semiconductor device can include a substrate comprising a surface with a thin film transistor formed thereon; a first passivation layer formed over the thin film transistor; a slot or trench formed in the first passivation layer; and a second passivation layer formed over the first passivation layer and within the trench.

In another embodiment, a semiconductor device can include a substrate comprising a surface with a thin film transistor formed thereon; a silicon nitride layer formed over the source electrode, the drain electrode and the semiconductor layer; one or more trenches formed through the silicon nitride layer; and a silicon oxide layer formed over the silicon nitride layer and within the one or more trenches. The thin film transistor can include a gate electrode disposed over a substrate; the gate dielectric layer disposed over the gate electrode; the semiconductor layer disposed over the gate dielectric layer; a source electrode disposed over the semiconductor layer; and a drain electrode disposed over the semiconductor layer.

In another embodiment, a method for forming a thin film transistor can include forming a source electrode and a drain electrode over a semiconductor layer that is formed over a gate dielectric layer and a gate electrode, a first portion of the semiconductor layer is exposed between the source electrode and the drain electrode; depositing a first passivation layer over the source electrode, the drain electrode and the exposed first portion of the semiconductor layer; forming at least one trench in the first passivation layer between the source and the drain to expose a second portion of the semiconductor layer; and depositing a second passivation layer on the first passivation layer and within the trench.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to using trenches in the passivation layer to control the threshold voltage of a TFT. A TFT has a threshold voltage which is the voltage at the gate which is required for current to flow between the source and the drain. By forming one or more slots or trenches through the passivation layer, and then filling the slots or trenches with additional passivation material, the threshold voltage can be corrected such that current flow is better controlled by the gate when the gate is either on or off based on voltage received.

The invention is illustratively described below utilized in a processing system, such as a plasma enhanced chemical vapor deposition (PECVD) system available from AKT America, a division of Applied Materials, Inc., located in Santa Clara, Calif. However, it should be understood that the invention has utility in other system configurations, including those sold by other manufacturers.

Figure 1:
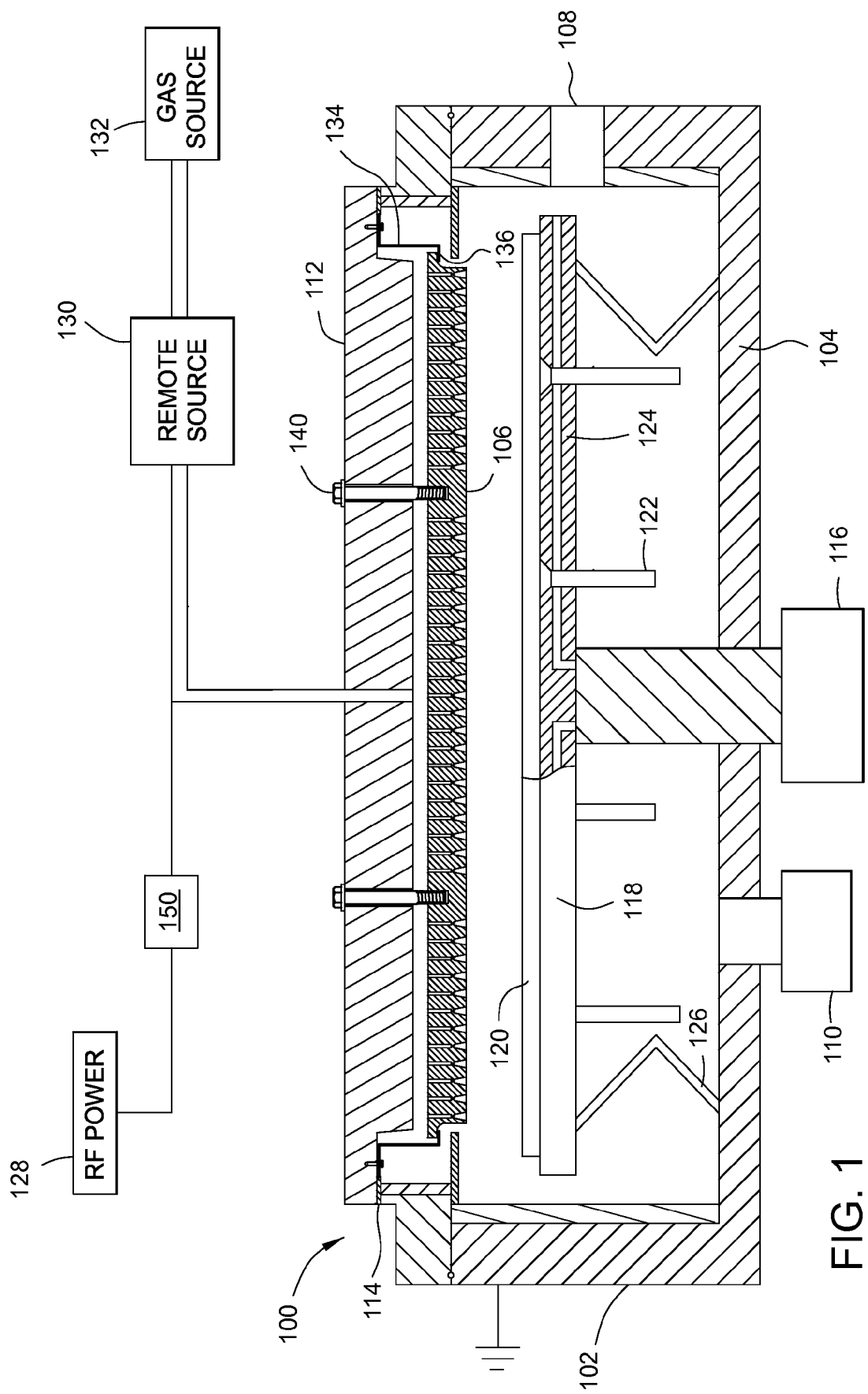
FIG. 1 is a cross-sectional schematic view of a PVD chamber according to one embodiment of the invention.

FIG. 1 is a schematic, cross sectional view of an apparatus that may be used to perform the operations described herein. The apparatus includes a chamber 100 in which one or more films may be deposited onto a substrate 120. The chamber 100 generally includes walls 102, a bottom 104 and a showerhead 106 which define a process volume. A substrate support 118 is disposed within the process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move a substrate to and from the substrate receiving surface. The substrate support 118 may also include heating and/or cooling elements 124 to maintain the substrate support 118 at a desired temperature. The substrate support 118 can also include RF return straps 126 to provide an RF return path at the periphery of the substrate support 118.

The showerhead 106 can be coupled to a backing plate 112 by a fastening mechanism 140. The showerhead 106 may be coupled to the backing plate 112 by one or more fastening mechanisms 140 to help prevent sag and/or control the straightness/curvature of the showerhead 106.

A gas source 132 can be coupled to the backing plate 112 to provide process gases through gas passages in the showerhead 106 to a processing area between the showerhead 106 and the substrate 120. The gas source 132 can include a silicon-containing gas supply source, an oxygen containing gas supply source, and a nitrogen-containing gas supply source, among others. Typical process gases useable with one or more embodiments include silane ($SiH_4$), disilane, $N_2O$, ammonia ($NH_3$), $H_2$, $N_2$ or combinations thereof.

A vacuum pump 110 is coupled to the chamber 100 to control the process volume at a desired pressure. An RF source 128 can be coupled through a match network 150 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by the RF source 128 provided to the showerhead 106.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 100.

Figure 2A:
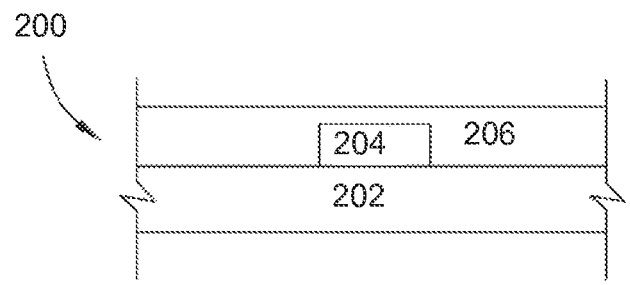
FIGS. 2A-2C are schematic cross-sectional views of a TFT at various stages of production.
Figure 2B:
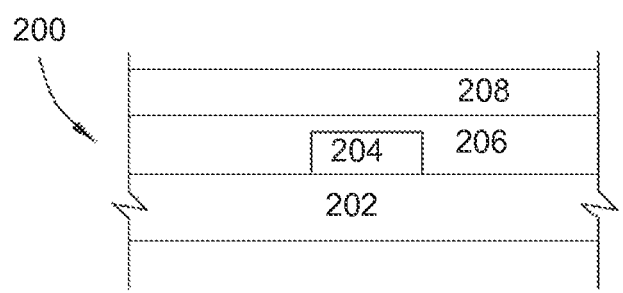
Figure 2C:
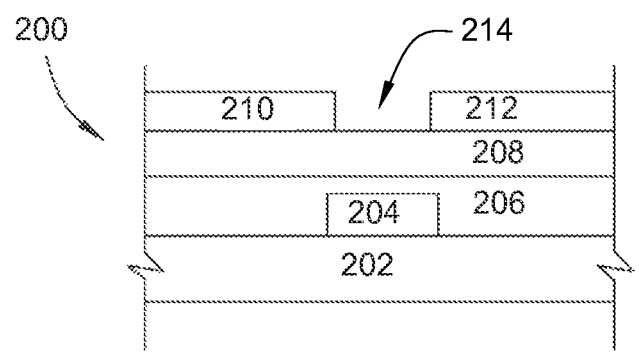

FIGS. 2A-2C are schematic cross-sectional views of a TFT 200 at various stages of production. As shown in FIG. 2A, a gate electrode 204 is formed over a substrate 202. Suitable materials that may be utilized for the substrate 202 include, but not limited to, silicon, germanium, silicon-germanium, soda lime glass, glass, semiconductor, plastic, steel or stainless steel substrates. Suitable materials that may be utilized for the gate electrode 204 include, but are not limited to, chromium, copper, aluminum, tantalum, titanium, molybdenum, and combinations thereof, or transparent conductive oxides (TCO) such as indium tin oxide (ITO) or fluorine doped zinc oxide (ZnO:F) which are commonly used as transparent electrodes. The gate electrode 204 may be deposited by suitable deposition techniques such as PVD, MOCVD, a spin-on process and printing processes. The gate electrode 204 may be patterned using an etching process.

Over the gate electrode 204, a gate dielectric layer 206 may be deposited. Suitable materials that may be used for the gate dielectric layer 206 include silicon dioxide, silicon oxynitride, silicon nitride, aluminum oxide or combinations thereof. The gate dielectric layer 206 may be deposited by suitable deposition techniques including plasma enhanced chemical vapor deposition (PECVD).

A semiconductor layer 208 is then formed over the gate dielectric layer 206 as shown in FIG. 2B. Suitable materials that may be used for the semiconductor layer 208 include Indium Gallium Zinc Oxide (IGZO), Zinc Oxynitride (ZnON) $ZnO_xN_y$, $SnO_xN_y$, $InO_xN_y$, $CdO_xN_y$, $GaO_xN_y$, $ZnSnO_xN_y$, $ZnInO_xN_y$, $ZnCdO_xN_y$, $ZnGaO_xN_y$, $SnInO_xN_y$, $SnCdO_xN_y$, $SnGaO_xN_y$, $InCdO_xN_y$, $InGaO_xN_y$, $CdGaO_xN_y$, $ZnSnInO_xN_y$, $ZnSnCdO_xN_y$, $ZnSnGaO_xN_y$, $ZnInCdO_xN_y$, $ZnInGaO_xN_y$, $ZnCdGaO_xN_y$, $SnInCdO_xN_y$, $SnInGaO_xN_y$, $SnCdGaO_xN_y$, $InCdGaO_xN_y$, $ZnSnInCdO_xN_y$, $ZnSnInGaO_xN_y$, $ZnInCdGaO_xN_y$, and $SnInCdGaO_xN_y$. Each of the aforementioned semiconductor films may be doped by a dopant. The semiconductor layer 208 may be deposited by suitable deposition methods, such as PVD. In practice, the semiconductor layer 208 is oftentimes referred to as the channel layer, the active layer or the semiconductor active layer.

As shown in FIG. 2C, over the semiconductor layer 208, the source electrode 210 and the drain electrode 212 are formed. The exposed portion of the semiconductor layer 208 between the source and drain electrodes 210, 212 is referred to as the slot or trench 214. Suitable materials for the source and drain electrodes 210, 212 include chromium, copper, aluminum, tantalum, titanium, molybdenum, and combinations thereof, or TCOs mentioned above. The source and drain electrodes 210, 212 may be formed by suitable deposition techniques, such as PVD followed by patterning through etching.

Figure 3A:
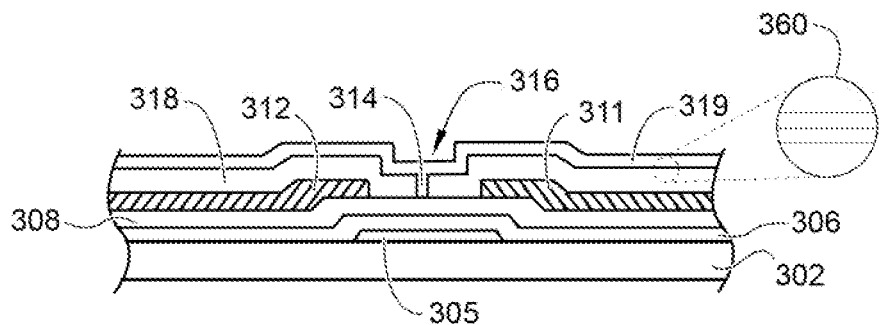
FIGS. 3A-3C depict TFT devices incorporating one or more slots or trenches according to one embodiment.
Figure 3B:
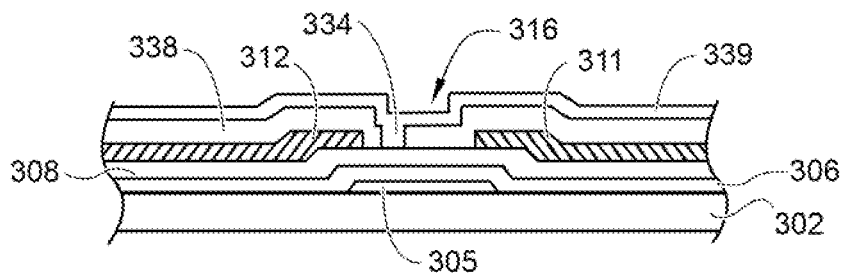
Figure 3C:
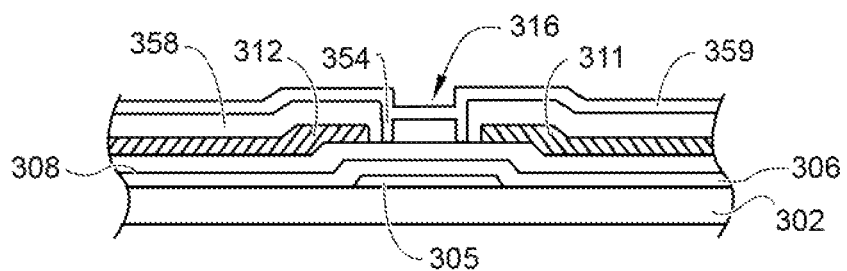

FIGS. 3A-3C depict TFT devices incorporating a slot according to one or more embodiments. In this depiction, the substrate 302 has a stack with one or more layers which are deposited and etched as described with reference to FIGS. 2A-2C, including a gate electrode 305, a gate dielectric layer 306, a semiconductor layer 308, a source electrode 311 and a drain electrode 312.

Depicted in FIG. 3A, a first passivation layer 318 is deposited over an exposed semiconductor material 316, the source electrode 311 and the drain electrode 312. In one embodiment, the first passivation layer 318 is a silicon oxide or silicon nitride layer, such as $SiO_x$, SiN, SiON or combinations thereof. The first passivation layer 318 can be deposited to a thickness of from 20 Å to 3000 Å. The first passivation layer 318 can be deposited using CVD, PECVD, ALD or other deposition techniques known in the art. Deposition gases for depositing the first passivation layer 318 can include silanes, such as $SiH_4$, $N_2O$, $O_2$, $N_2$, an inert carrier gas, such as Ar, or combinations thereof. As depicted, the deposition of the first passivation layer 318 is substantially conformal across the surface of the exposed semiconductor material 316, the source electrode 311 and drain electrode 312. The first passivation layer 318 can have a low flat band voltage. In one embodiment, the flat band voltage of the first passivation layer 318 can be lower than −10 V. In another embodiment, the flat band voltage of the first passivation layer 318 can be approximately 0 V.

A trench 314 is then formed in the first passivation layer 318 between the source electrode 311 and the drain electrode 312 to expose the semiconductor layer 308. The trench 314 can formed by patterning the first passivation layer 318. The first passivation layer 318 can be patterned by forming either a photolithographic mask or a hard mask over the first passivation layer 318 and exposing the first passivation layer 318 to an etchant. The first passivation layer 318 may be patterned by exposing the exposed portions of the first passivation layer 318 to a wet etchant or to an etching plasma. In one embodiment, the etching plasma can comprise gases selected from $SF_6$, $O_2$, $Cl_2$, or combinations thereof.

The trench 314 is generally a slot or trench which extends at least the length of the source electrode 311 and drain electrode 312. In one embodiment, the source electrode 311 and the drain electrode 312 are both approximately 40 microns wide and the trench 314 extends approximately 50 microns to 60 microns. Thus, the ratio of the source/drain electrode width to the slot or trench length can be from 1:1 to 1:2, such as between 1:1 and 1:1.5. In this embodiment, the width of the slot or trench can be from about 1 micron to about 3 microns, such as about 2 microns. In further embodiments, the trench 314 can extend to multiple TFTs such that the trench is formed above the active channel region for each of the TFTs involved.

The trench 314 can be parallel to the edge of either the source electrode 311 or the drain electrode 312. The trench 314 can be positioned at one or more locations in the portion of the first passivation layer 318 which is above the exposed semiconductor material 316. Depicted here, the trench 314 is positioned approximately in the center of the first passivation layer 318. However, the positioning of the trench 314 may be shifted within the region of the exposed semiconductor material 316.

Once the trench 314 is etched, the exposed semiconductor material 316 can be treated with an activated gas. The activated gas can include oxygen, nitrogen or combinations thereof. The activated gas can be activated by plasma and delivered to the substrate to expose the exposed semiconductor material 316, where the activated gas can be incorporated into the exposed portion of the exposed semiconductor material 316. After the trench 314 is etched into the first passivation layer 318 and any treatment performed, a second passivation layer 319 is then formed over the surface of the first passivation layer 318 and the trench 314. The second passivation layer 319 can be deposited generally in the same manner as the first passivation layer 318. The second passivation layer 319 is composed of a separate passivation material from that of the first passivation layer 318. In one example, the first passivation layer 318 is composed of silicon nitride and the second passivation layer 319 is composed of silicon oxide. In one or more embodiments, the material deposited in the trench 314 is the same material used to form the second passivation layer 319. The first passivation layer 318 or the second passivation layer 319 may be deposited with or treated with either p-type dopants or n-type dopants.

Further, the first passivation layer 318, the second passivation layer 319 or combinations thereof, can be composed of one or more sublayers, such that the first passivation layer 318 or the second passivation layer 319 are composed of a plurality of sublayers, shown at 360. The sublayers may be composed of silicon oxide or silicon nitride, such as $SiO_x$, SiN, SiON or combinations thereof. The sublayers of the first passivation layer 318 or the second passivation layer 319 may have different compositions between them. The sublayers which interface between the first passivation layer 318 and the second passivation layer 319 should be of a different composition than one another. In one example, the first passivation layer 318 is composed of a single layer of SiN and the second passivation layer is composed of three layers, where the first layer is SiO, the second layer is SiON and the third layer is SiO. The first layer of the second passivation layer 319 forms the interface with the first passivation layer 318. Further permutations are envisioned without further specific recitation.

FIG. 3B depicts a first passivation layer 338 deposited over the exposed semiconductor material 316, the source electrode 311 and drain electrode 312. The first passivation layer 338 can be substantially similar to the passivation layer 318 described with reference to FIG. 3A. In this embodiment, the passivation layer 338 has a trench 334 formed therein. The trench insert can be formed using the photomask/etch method described with reference to FIG. 3A. The trench 334 is wider in this embodiment and offset toward the drain electrode 312. After the trench 334 is etched into the first passivation layer 338, a second passivation layer 339 is then formed over the surface of the first passivation layer 338 and in the trench 334. The second passivation layer 339 can be substantially similar to the second passivation layer described with reference to FIG. 3A.

FIG. 3C depicts a first passivation layer 358 deposited over the exposed semiconductor material 316, the source electrode 311 and drain electrode 312. The first passivation layer 358 can be substantially similar to the passivation layer 318 described with reference to FIG. 3A. In this embodiment, the passivation layer 358 has two trenches 354 formed therein. The trenches 354 are formed near both the source electrode 311 and the drain electrode 312. After the trench 354 is etched into the first passivation layer 358, a second passivation layer 359 is then formed over the surface of the first passivation layer 358 and in the trench 354. The second passivation layer 359 can be substantially similar to the second passivation layer described with reference to FIG. 3A.

The trenches described above are believed to improve the threshold voltage ($V_{th}$) of the TFT. The $V_{th}$ is the value of the gate-source voltage when the conducting channel just begins to connect the source and drain contacts of the transistor, allowing significant current to flow. Though, optimally, this voltage would be zero, most modern TFTs do not achieve an optimal $V_{th}$. Thus, many modern TFT can have a low steady current between the source electrode and the drain electrode, even when the gate is not receiving voltage. The trench is believed to shift the actual $V_{th}$ closer to the optimal $V_{th}$ through the creation of a second field which interferes with the first field.

While the foregoing is directed to embodiments of the present invention, other and further embodiments of the invention may be devised without departing from the basic scope thereof, and the scope thereof is determined by the claims that follow.

The invention claimed is:

1. A semiconductor device, comprising:
   a substrate comprising a surface with a thin film transistor formed thereon;
   a first passivation layer formed over the thin film transistor, the first passivation layer having a trench formed therethrough; and
   a second passivation layer formed over the first passivation layer and within the trench, wherein the trench has a width of from approximately 1 micron to 3 microns.

2. A semiconductor device, comprising: a substrate comprising a surface with a thin film transistor formed thereon, wherein the thin film transistor comprises: a gate electrode disposed over a substrate; a gate dielectric layer disposed over the gate electrode; a semiconductor layer disposed over the gate dielectric layer; a source electrode disposed over the semiconductor layer; and a drain electrode disposed over the semiconductor layer; a first passivation layer formed over the thin film transistor, the first passivation layer having a trench formed therethrough; and a second passivation layer formed over the first passivation layer and within the trench, wherein the source and drain electrode has a source/drain electrode width at an active region and the trench has a trench length, wherein the ratio of the source/drain electrode width to the trench length is from approximately 1:1 to approximately 1:2.

3. A semiconductor device, comprising:
   a substrate comprising a surface with a thin film transistor formed thereon;

a first passivation layer formed over the thin film transistor, the first passivation layer having a trench formed therethrough; and
a second passivation layer formed over the first passivation layer and within the trench, wherein one or more dopants are deposited to create an interface between the first passivation layer and the second passivation layer.

4. A semiconductor device, comprising:
a substrate comprising a surface with a thin film transistor formed thereon, the thin film transistor comprising:
  a gate electrode disposed over a substrate;
  a gate dielectric layer disposed over the gate electrodes;
  a semiconductor layer disposed over the gate dielectric layer;
  a source electrode disposed over the semiconductor layer; and
  a drain electrode disposed over the semiconductor layer;
a silicon nitride layer formed over the source electrode, the drain electrode and the semiconductor layer, the silicon nitride layer having a trench formed therethrough; and
a silicon oxide layer formed over the silicon nitride layer and within the trench, wherein the semiconductor layer comprises Indium Gallium Zinc Oxide (IGZO) or Zinc Oxynitride (ZnON).

5. A semiconductor device, comprising:
a substrate comprising a surface with a thin film transistor formed thereon, the thin film transistor comprising:
  a gate electrode disposed over a substrate;
  a gate dielectric layer disposed over the gate electrode;
  a semiconductor layer disposed over the gate dielectric layer;
  a source electrode disposed over the semiconductor layer; and
  a drain electrode disposed over the semiconductor layer;
a silicon nitride layer formed over the source electrode the drain electrode and the semiconductor layer, the silicon nitride layer having a trench formed therethrough; and
a silicon oxide layer formed over the silicon nitride layer and within the trench, wherein the trench extends through the silicon nitride layer to the semiconductor layer.

6. A semiconductor device, comprising:
a substrate comprising a surface with a thin film transistor formed thereon, the thin film transistor comprising:
  a gate electrode disposed over a substrate;
  a gate dielectric layer disposed over the slate electrode;
  a semiconductor layer disposed over the gate dielectric layer;
  a source electrode disposed over the semiconductor layer; and
  a drain electrode disposed over the semiconductor layer;
a silicon nitride layer formed over the source electrode, the drain electrode and the semiconductor layer, the silicon nitride layer having a trench formed therethrough; and
a silicon oxide layer formed over the silicon nitride layer and within the trench, wherein the trench has a width of from approximately 1 micron to 3 microns.

7. A semiconductor device, comprising:
a substrate comprising a surface with a thin film transistor formed thereon, the thin film transistor comprising:
  a gate electrode disposed over a substrate;
  a gate dielectric layer disposed over the gate electrode;
  a semiconductor layer disposed over the gate dielectric layer;
  a source electrode disposed over the semiconductor layer; and
  a drain electrode disposed over the semiconductor layer;
a silicon nitride layer formed over the source electrode the drain electrode and the semiconductor layer, the silicon nitride layer having a trench formed therethrough; and
a silicon oxide layer formed over the silicon nitride layer and within the trench, wherein the source and drain electrode has a source/drain electrode width and the trench has a trench length, wherein the ratio of the source/drain electrode width to the trench length is from approximately 1:1 to approximately 1:2.

8. A semiconductor device, comprising:
a substrate comprising a surface with a third film transistor formed thereon, the thin film transistor comprising:
  a gate electrode disposed over a substrate;
  a gate dielectric layer disposed over the gate electrode;
  a semiconductor layer disposed over the gate dielectric layer;
  a source electrode disposed over the semiconductor layer; and
  a drain electrode disposed over the semiconductor layer;
a silicon nitride layer formed over the source electrode, the drain electrode and the semiconductor layer, the silicon nitride layer having a trench formed therethrough; and
a silicon oxide layer formed over the silicon nitride layer and within the trench, wherein one or more dopants are deposited in the semiconductor layer.

9. A semiconductor device, comprising:
a substrate comprising a surface with a thin film transistor formed thereon, the thin film transistor comprising:
  a gate electrode disposed over a substrate;
  a gate dielectric layer disposed over the gate electrode;
  a semiconductor layer disposed over the gate dielectric layer;
  a source electrode disposed over the semiconductor layer; and
  a drain electrode disposed over the semiconductor layer;
a silicon nitride layer formed over the source electrode the drain electrode and the semiconductor layer, the silicon nitride layer having a trench formed therethrough; and
a silicon oxide layer formed over the silicon nitride layer and within the trench, wherein the silicon oxide layer, the silicon nitride layer or both comprise a plurality of sublayers, wherein the sublayers which interface between the silicon nitride layer and the silicon oxide layer have a different composition.

* * * * *

UNITED STATES PATENT AND TRADEMARK OFFICE
CERTIFICATE OF CORRECTION

PATENT NO.          : 8,975,625 B2                                          Page 1 of 1
APPLICATION NO.     : 13/932340
DATED               : March 10, 2015
INVENTOR(S)         : Ye et al.

It is certified that error appears in the above-identified patent and that said Letters Patent is hereby corrected as shown below:

In Claims:

Column 7, Claim 4, Line 12, please delete "electrodes" and insert --electrode-- therefor;

Column 7, Claim 5, Line 35, please insert --,-- after electrode;

Column 7, Claim 6, Line 46, please delete "slate" and insert --gate-- therefor;

Column 7, Claim 6, Line 54, please delete "haying" and insert --having-- therefor;

Column 8, Claim 7, Line 12, please insert --,-- after electrode;

Column 8, Claim 8, Line 21, please delete ";" and insert --:-- after comprising therefor;

Column 8, Claim 8, Line 22, please delete "third" and insert --thin-- therefor;

Column 8, Claim 9, Line 47, please insert --,-- after electrode.

Signed and Sealed this
Twenty-fifth Day of August, 2015

Michelle K. Lee
*Director of the United States Patent and Trademark Office*